(12) United States Patent
Goodson et al.

(10) Patent No.: US 9,397,675 B1
(45) Date of Patent: Jul. 19, 2016

(54) HYBRID FREQUENCY SYNTHESIZER AND METHOD

(71) Applicant: Shure Acquisition Holdings, Inc., Niles, IL (US)

(72) Inventors: Michael Goodson, Union, IL (US); Yang Tang, Wilmette, IL (US)

(73) Assignee: Shure Acquisition Holdings, Inc., Niles, IL (US)

( * ) Notice: Subject to any disclaimer, the term of this patent is extended or adjusted under 35 U.S.C. 154(b) by 0 days.

(21) Appl. No.: 14/815,523

(22) Filed: Jul. 31, 2015

(51) Int. Cl.
*H03L 7/16* (2006.01)
*H03M 3/00* (2006.01)

(52) U.S. Cl.
CPC . *H03L 7/16* (2013.01); *H03M 3/32* (2013.01); *H03M 3/50* (2013.01)

(58) Field of Classification Search
CPC .............. H03L 7/06; H03L 7/16; H03L 7/18; H03L 7/197; H03L 7/1972; H03M 3/30; H03M 3/32; H03M 3/50
USPC .................................. 327/105, 107, 156, 159
See application file for complete search history.

(56) References Cited

U.S. PATENT DOCUMENTS

| | | | |
|---|---|---|---|
| 4,965,533 A | 10/1990 | Gilmore | |
| 5,563,535 A * | 10/1996 | Corry | H03C 3/00 327/105 |
| 6,198,353 B1 | 3/2001 | Janesch et al. | |
| 6,690,215 B2 | 2/2004 | McCune, Jr. et al. | |
| 6,825,729 B2 | 11/2004 | Splett | |
| 2002/0008588 A1* | 1/2002 | Khan | G06F 1/0328 331/18 |
| 2011/0032013 A1* | 2/2011 | Nelson | B60Q 1/444 327/156 |
| 2011/0051820 A1* | 3/2011 | Fornage | H04B 3/54 375/258 |
| 2011/0057688 A1* | 3/2011 | Mamaril | H03B 28/00 327/113 |

* cited by examiner

*Primary Examiner* — William Hernandez
(74) *Attorney, Agent, or Firm* — William J. Lenz, Esq.; Neal, Gerber & Eisenberg LLP

(57) ABSTRACT

Embodiments include a hybrid frequency synthesizer comprising a direct digital synthesizer configured to generate a digital output signal having a frequency determined by an input signal received from an externally-generated signal source. The hybrid frequency synthesizer further includes a delta sigma modulator configured to generate a delta-sigma modulated signal based on the digital output signal, the delta sigma modulator being coupled to the direct digital synthesizer. The hybrid frequency synthesizer also includes a digital-to-analog converter configured to convert the delta-sigma modulated signal into an analog output signal, the digital-to-analog converter being coupled to the delta-sigma modulator. Moreover, the hybrid frequency synthesizer includes a bandpass filter configured to remove interference frequencies from the analog output signal, the bandpass filter being coupled to the digital-to-analog converter; and a phase locked loop coupled to the band pass filter and driven by a reference signal received therefrom.

16 Claims, 3 Drawing Sheets

HYBRID FREQUENCY SYNTHESIZER AND METHOD

TECHNICAL FIELD

This application generally relates to frequency synthesizers and methods involving the same. In particular, this application relates to hybrid frequency synthesizers comprising a phase locked loop driven by a direct digital synthesizer.

BACKGROUND

Many electronic systems, including audio and communications systems, require generation of a high quality, agile signal source for use as, for example, a local oscillator, sample clock, frequency modulator, or the like. For this purpose, such systems typically include signal or frequency synthesizers, which can be tuned within a few microseconds over the entire frequency band that is available for a given output signal.

One traditional type of frequency synthesizer is a phase locked loop ("PLL"), which is a feedback control system that generates an output signal having a phase that is related to the phase of an input reference signal. During operation of a common PLL, the input reference signal is provided to a phase frequency detector, which generates a voltage signal that is provided to a low pass filter ("LPF") to improve loop stability and eliminate any reference spurs in the voltage signal. An output of the low pass filter is used to drive a voltage controlled oscillator ("VCO"), which generates an output signal with an oscillation frequency that is controlled by the input voltage. The PLL circuit further includes a feedback path or loop, and the VCO output signal is provided to a frequency or loop divider on this path. The divider (also referred to herein as an "N divider") divides the frequency of the VCO output signal by an integer value N that is selected so that the divided frequency is exactly the same as the reference frequency. An output of the N divider is provided to the phase frequency detector as a second input, along with the fixed reference signal. The phase frequency detector compares the phase and frequencies of the two input signals and outputs a voltage proportional to a difference in phase and/or frequency between the two input signals. This voltage is then used to drive the VCO, thereby completing the feedback loop of the PLL. In this manner, the output of the VCO can be locked to the phase of the reference signal and the reference frequency, or an N multiple thereof.

There are several factors that affect the performance of a PLL system and make it difficult to design an ideal PLL that has, for example, narrow channel spacing and a broad range of output frequencies. As a result, the traditional PLL system, also known as an "integer N PLL," typically has several drawbacks, including, for example, slow settling times and high in-band noise levels that are difficult to filter out. For example, the magnitude of the integer value, N, of the loop divider impacts the noise performance of the feedback loop because any phase noise or spurious noise in the reference frequency will appear in the loop output with its original magnitude multiplied by N. As a result, the noise level increases substantially when the N value is large. However, a large N value is required in order to achieve high frequency resolution and to accommodate VCO output signal frequencies that are large compared to the reference frequency (e.g., a large multiple thereof).

As another example, the frequency of the reference signal determines the frequency resolution, or step size, of the PLL, such that the lower the reference frequency, the higher the frequency resolution and number of frequency channels. However, there is a tradeoff between frequency resolution and settling time (also referred to as "lock time" or "frequency switching time"), which is the amount of time it takes a PLL to change to a new output frequency (e.g., during frequency hopping or when changing channels). While a smaller settling time is preferred, so that the PLL settles on the new frequency as quickly as possible, this requires a higher reference frequency. As will be appreciated, the bandwidth of the loop filter is typically five to ten percent of the reference frequency and has an inverse effect on the settling time of the PLL (i.e. the wider the bandwidth of the loop filter, the faster the settling time). However, a higher reference frequency means lower frequency resolution for the PLL, which is not desirable. And a wider bandwidth on the loop filter is not desirable because this can degrade loop stability and may not effectively reduce spurious emissions produced by the reference frequency and its harmonics.

To resolve some of the performance challenges in the integer N PLL, a "fractional N" PLL may be used. This PLL system uses non-integer frequency division to provide a finer frequency resolution than the more traditional PLL, or lower output noise for an identical resolution. However, the fractional N PLL still suffers from spurious tones in the output signal, as will be appreciated.

Another existing type of frequency synthesizer is a direct digital synthesizer ("DDS"), which is a sampled data system that creates periodic digital signals, or arbitrary waveforms, from a single, fixed-frequency reference clock. A DDS can be used to synthesize a frequency lower than that of its input clock or reference signal. Advantages of the DDS over the traditional PLL include better frequency agility, improved phase noise, and precise control of the output phase across frequency switching transitions. However, traditional DDS systems also have certain drawbacks, including, for example, the difficulty of filtering out higher order harmonics in the output signal due to aliasing and a higher noise floor at large frequency offsets. As will be appreciated, in order to achieve good signal quality, the signals produced by a frequency synthesizer must have very little phase or spurious noise, or a high spectral purity. In a DDS circuit, the spectral purity of the output signal is primarily determined by a digital-to-analog converter ("DAC") coupled in series with the DDS to generate an analog output signal based on the digital signal produced by the DDS. However, even an ideal N-bit DAC will produce harmonics with an amplitude that is dependent on the ratio of the output frequency to the clock frequency, thereby contributing to the higher noise floor of the conventional DDS. Further, the higher order harmonics produced by the DAC fold back into the Nyquist bandwidth, making them unfilterable.

As an attempt to resolve some of the above performance challenges in traditional frequency synthesizers, U.S. Pat. No. 4,965,533 describes a hybrid frequency synthesizing system 100 that includes a DDS circuit 102 for generating the input reference signal of an integer N PLL 104, as shown in FIG. 1. Due to inclusion of the DDS circuit 102, the hybrid system 100 provides a higher frequency resolution and frequency range than the traditional PLL, as well as a faster settling time. More specifically, as shown in FIG. 1, a stable signal source 106 is applied as an input to a DDS 108, and a digital output of the DDS 108 is applied to an N-bit digital-to-analog converter ("DAC") 110 included in the DDS circuit 102 to convert the digital output of the DDS 108 into an analog signal. A bandpass filter ("BPF") 112 is included in the path between the DDS circuit 102 and the integer N PLL 104 to suppress or eliminate wideband spurious noise from the output signal of the DDS circuit 102, so that a magnitude of the spurs are not multiplied by the value N of an N divider 114 included in a feedback loop 116 the PLL 104. As will be appreciated, the integer N PLL 104 includes a phase frequency detector ("PFD") 118, a low pass filter ("LPF") 120, and a voltage controlled oscillator ("VCO") 122, all connected in series, as is conventional. As shown in FIG. 1, the filtered DDS output signal is input to the PFD 118 as the input reference signal of the PLL 104. By using the DDS circuit 102 as the reference to the PLL 104, the reference frequency can be varied in extremely small steps (i.e. with a very fine frequency resolution), while the PLL 104 can have a relatively large frequency step size and therefore, a wide permissible bandwidth for the loop filter 120, thereby providing a faster settling time for the PLL 104.

However, the existing DDS driven PLL hybrid system 100 still has certain drawbacks that fall short of providing a practical, high performance solution. For example, the system 100 is expensive to manufacture and consumes a large amount of power, due at least in part to the N-bit DAC 102. Further, the prior art system 100 is susceptible to spurious tones because the N-bit DAC 110 is a weighted Nyquist digital-to-analog converter with a spurious free dynamic range that limits the spurious performance of the DDS system 102. As will be appreciated, while any remaining spurious signals in the output signal received from the BPF 112 can be filtered out by the PLL 104 if outside the bandwidth of the PLL 104, any spurs that are within this bandwidth are multiplied by the PLL 104. While, in theory, the quantization noise introduced by the DDS 108 is expected to spread uniformly over the Nyquist bandwidth, practical applications have shown that this is not the case even when using an N-bit DAC. Instead, the quantization noise is highly signal dependent and may be concentrated at multiples of the output frequency. As a result, even an ideal multi-bit DAC will produce harmonics in the output signal, which are ultimately fed to the PLL 104 being driven by the DDS system 102.

SUMMARY

The invention is intended to solve the above-noted problems by providing systems and methods that are designed to provide, among other things, a hybrid frequency synthesizer comprising a delta-sigma modulated direct digital synthesizer ("DDS") for driving a phase locked loop ("PLL") that can (1) generate a high quality signal source with a high signal-to-noise ratio ("SNR") and low spurious tones, (2) provide a faster settling or lock time when the system is frequency hopping or otherwise changing to a new frequency, and (3) lower power consumption and overall circuit cost.

One example embodiment includes a hybrid frequency synthesizer comprising a direct digital synthesizer configured to generate a digital output signal having a frequency determined by an input signal received from an externally-generated signal source. The hybrid frequency synthesizer further includes a delta sigma modulator configured to generate a delta-sigma modulated signal based on the digital output signal, the delta sigma modulator being coupled to the direct digital synthesizer. The hybrid frequency synthesizer also includes a digital-to-analog converter configured to convert the delta-sigma modulated signal into an analog output signal, the digital-to-analog converter being coupled to the delta-sigma modulator. Moreover, the hybrid frequency synthesizer includes a bandpass filter configured to remove interference frequencies from the analog output signal, the bandpass filter being coupled to the digital-to-analog converter; and a phase locked loop coupled to the band pass filter and driven by a reference signal received therefrom.

In another example embodiment, an electronic circuit for driving a phase locked loop is provided. The electronic circuit includes a direct digital synthesizer configured to generate a digital output signal having a frequency determined by an input received from an externally-generated signal source; and a delta sigma modulator configured to generate a delta-sigma modulated signal based on the digital output signal, the delta sigma modulator being coupled to the direct digital synthesizer. The electronic circuit further includes a digital-to-analog converter configured to convert the delta-sigma modulated signal into an analog output signal, the digital-to-analog converter being coupled to the delta-sigma modulator. The electronic circuit also includes a bandpass filter coupled to the digital-to-analog converter and configured to remove interference frequencies from the analog output signal and provide a reference signal for driving the phase locked loop.

Another example embodiment includes a method of driving a phase locked loop in a hybrid frequency synthesizer. The method includes using a direct digital synthesizer, generating a synthesized output having a frequency determined by an input received from an externally-generated signal source. The method also includes using a delta-sigma modulator, generating a delta-sigma modulated signal based on the synthesized output provided by the direct digital synthesizer; and converting the delta-sigma modulated signal to an analog reference signal using a digital-to-analog converter coupled to the delta-sigma modulator. The method further includes removing interference frequencies from the analog reference signal using a bandpass filter coupled to the delta-sigma modulator; and providing an output signal of the bandpass filter to the phase locked loop as a reference signal for driving the phase locked loop.

These and other embodiments, and various permutations and aspects, will become apparent and be more fully understood from the following detailed description and accompanying drawings, which set forth illustrative embodiments that are indicative of the various ways in which the principles of the invention may be employed.

DETAILED DESCRIPTION

Figure 1:
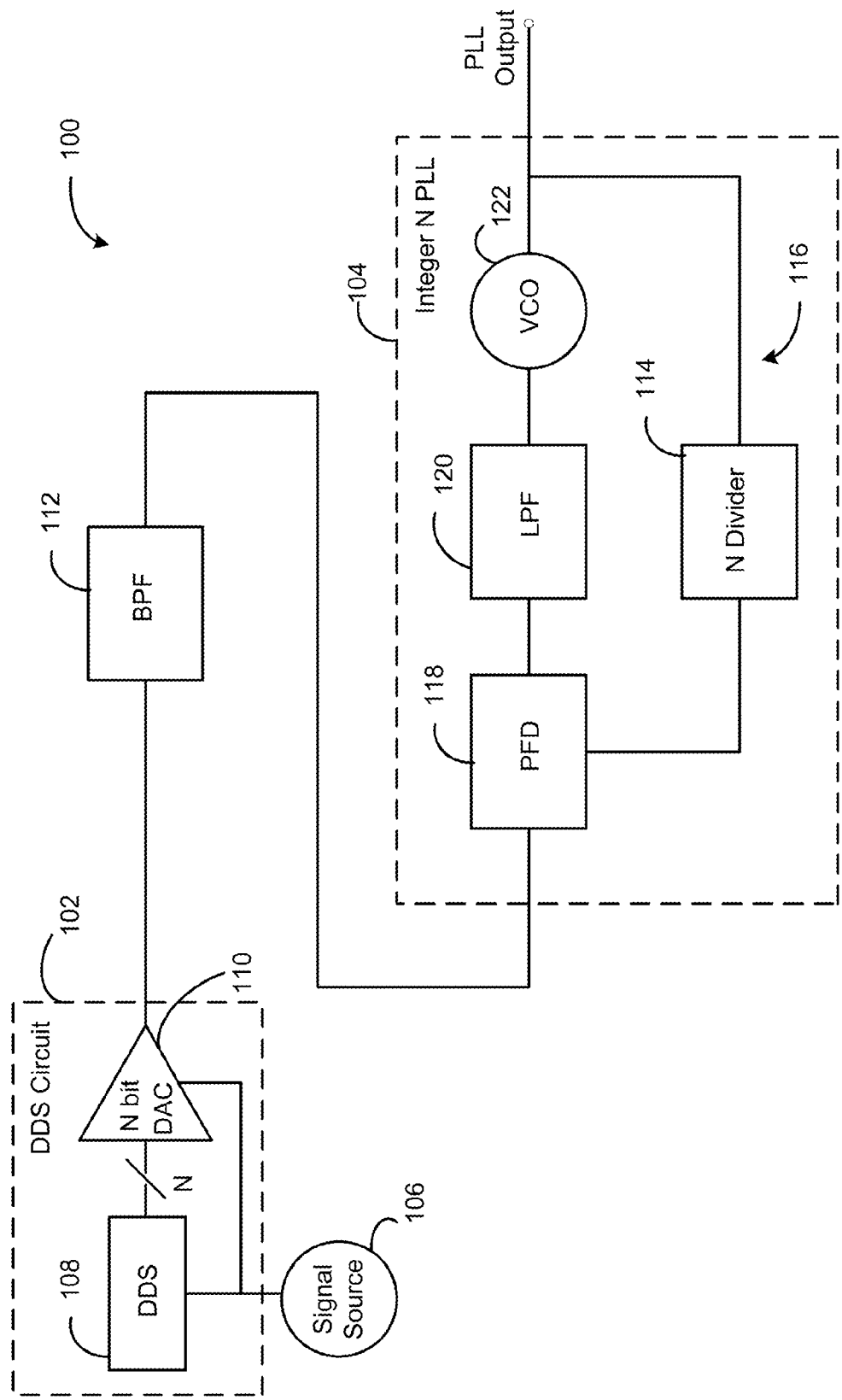
FIG. 1 is a block diagram depicting a conventional hybrid frequency synthesizer comprising a direct digital synthesizer driven phase locked loop.

The description that follows describes, illustrates and exemplifies one or more particular embodiments of the invention in accordance with its principles. This description is not provided to limit the invention to the embodiments described herein, but rather to explain and teach the principles of the invention in such a way as to enable one of ordinary skill in the art to understand these principles and, with that understanding, be able to apply them to practice not only the embodiments described herein, but also other embodiments that may come to mind in accordance with these principles. The scope of the invention is intended to cover all such embodiments that may fall within the scope of the appended claims, either literally or under the doctrine of equivalents.

It should be noted that in the description and drawings, like or substantially similar elements may be labeled with the same reference numerals. However, sometimes these elements may be labeled with differing numbers, such as, for example, in cases where such labeling facilitates a more clear description. Additionally, the drawings set forth herein are not necessarily drawn to scale, and in some instances proportions may have been exaggerated to more clearly depict certain features. Such labeling and drawing practices do not necessarily implicate an underlying substantive purpose. As stated above, the specification is intended to be taken as a whole and interpreted in accordance with the principles of the invention as taught herein and understood to one of ordinary skill in the art.

With respect to the exemplary systems, components and architecture described and illustrated herein, it should also be understood that the embodiments may be embodied by, or employed in, numerous configurations and components, including one or more systems, hardware, software, or firmware configurations or components, or any combination thereof, as understood by one of ordinary skill in the art. Accordingly, while the drawings illustrate exemplary systems including components for one or more of the embodiments contemplated herein, it should be understood that with respect to each embodiment, one or more components may not be present or necessary in the system.

Figure 2:
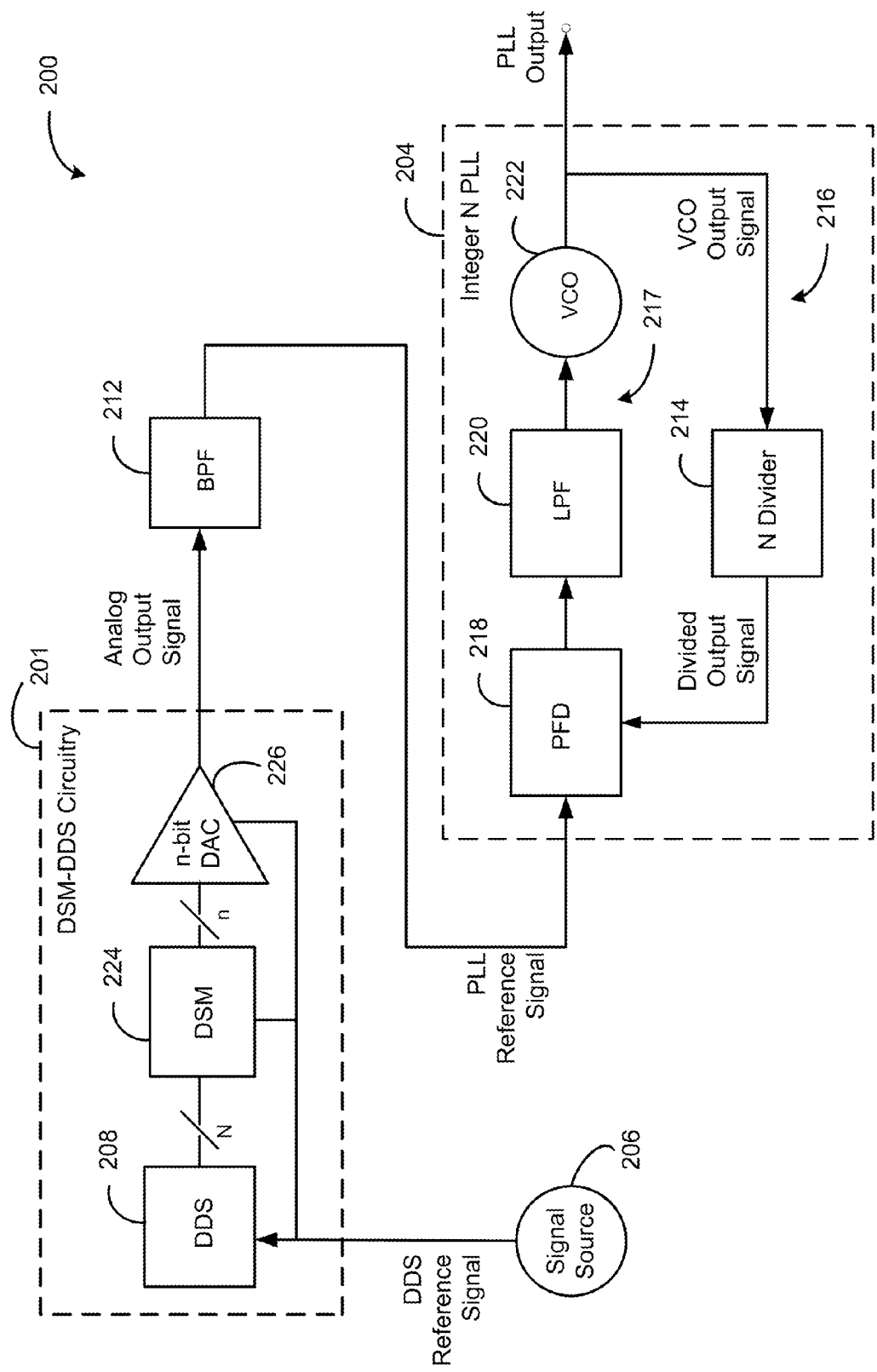
FIG. 2 is a block diagram depicting an example hybrid frequency synthesizer comprising a delta-sigma modulated direct digital synthesizer for driving a phase locked loop, in accordance with certain embodiments.

FIG. 2 illustrates a hybrid frequency synthesizer 200 comprising a delta-sigma modulated direct digital synthesizer ("DSM-DDS") circuit 201 for driving a phase locked loop ("PLL") 204 in accordance with embodiments. The hybrid frequency synthesizer 200 further includes a signal source 206 for providing an input reference signal to a direct digital synthesizer ("DDS") 208 included in the DSM-DDS circuit 201. The signal source 206 may be any type of stable clock, oscillator, or other reference capable of supplying a fixed-frequency signal. In a preferred embodiment, the signal source 206 is a crystal reference oscillator. In embodiments, the signal source 206 may be similar to the signal source 106 included in the hybrid system 100 of FIG. 1.

The hybrid frequency synthesizer 200 also includes a bandpass filter ("BPF") 212 with an input coupled to an output of the DSM-DDS circuit 201 and an output coupled to an input of the PLL 204. In embodiments, the BPF 212 may be similar to the BPF 112 included in the hybrid system 100 of FIG. 1. The BPF 212 is configured to suppress or eliminate interference signals or shaped noise (e.g., phase noise, spurious responses, quantization noise, harmonics, etc.) from an analog output signal of the DSM-DDS circuit 201, or otherwise enhance the spectral purity of the analog output signal. A filtered output of the BPF 212 is provided to the PLL 204 as the PLL input or reference signal, as shown in FIG. 2. The BPF 212 cleans the analog output signal before a magnitude of any noise or spurs therein can be multiplied by the PLL 204, and supplies a high fidelity, spectrally pure reference signal to the PLL 204. The bandwidth of the BPF 212 may be specifically configured based on an output frequency of the DSM-DDS circuit 201, a reference frequency of the signal source 206, and/or a ratio of the two frequencies, as will be appreciated by those skilled in the relevant art. In a preferred embodiment, the BPF 212 has narrow bandwidth and a steep a roll-off in order to reduce a switching time of the hybrid frequency synthesizer 200. In embodiments, the BPF 212 can be a crystal filter, a surface acoustic wave ("SAW") filter, or any other suitable filter.

The PLL 204 of the hybrid frequency synthesizer 200 can be an integer N PLL for generating an output signal with a periodic frequency that is an integer N multiple of the reference frequency (i.e. the frequency of the PLL reference signal). In embodiments, the PLL 204 of the hybrid frequency synthesizer 200 may be substantially similar to the PLL 104 of the hybrid system 100 shown in FIG. 1. As shown in FIG. 2, the PLL 204 includes a frequency divider 214 located on a feedback loop or path 216, that is coupled, in parallel, to a reference path 217 of the PLL 204. The reference path 217 comprises a phase frequency detector ("PFD") 218, a low pass filter ("LPF") 220, and a voltage controlled oscillator ("VCO") 222 coupled in series. The PFD 218 has two inputs, one coupled to the output of the BPF 212 to receive the PLL reference signal, and the other coupled to the output of the frequency divider 214 (also referred to herein as an "N divider") to receive a divided output signal from the N divider 214. The PFD 218 (also referred to as an "error detector") compares the two input signals and produces an error signal with a voltage that is proportional to the phase and/or frequency difference between the two signals. The error signal is filtered by the LPF 220 to eliminate any reference spurs and then provided to the VCO 222 as an input voltage signal. Driven by the input voltage signal, the VCO 222 generates an output signal, or the PLL output signal, with an oscillation frequency and phase that is controlled by the input voltage.

The VCO output signal is also fed back, along the feedback path 216, to the N divider 214, which divides the frequency of the signal by an integer value N that is selected so that the divided frequency is exactly the same as the reference frequency. When the two input signals received by the PFD 218 (i.e. the PLL reference signal and the divided output signal) are equal in phase and frequency, the error will be constant and the loop formed by the PLL 204 is said to be in a "locked" condition. If the divided output phase and/or frequency drifts from the reference signal, the error signal output by the PFD 218 will increase, which will drive the VCO 222 in an opposite direction so as to reduce the error. In this manner, the output phase and frequency of the PLL 204 can be adjusted to match the phase and frequency of the PLL reference signal.

According to embodiments, the DSM-DDS circuit 201 is configured to produce an analog output signal that is a reproduction of a desired analog signal (e.g., the DDS reference signal) using digital values generated by the DDS 208. As shown in FIG. 2, the DSM-DDS circuit 201 includes, in addition to the DDS 208, a delta sigma modulator ("DSM") 224 and a digital-to-analog converter ("DAC") 226. An input of the DDS 208 is coupled to the signal source 206 to receive the fixed-frequency reference signal, and an output of the DDS is coupled to the DSM 224. The DDS 208 is a discrete-value, discrete-time circuit for generating multiple frequencies from a reference frequency (i.e. the frequency of the DDS reference signal). The DDS 208 generates a sampled, digital version of the desired output waveform (e.g., a sinusoid) and provides the digital, periodic waveform to the DSM 224. The period of this waveform is controlled by an N-bit digital word contained in a frequency control register (not shown) of the DDS 208 to allow sub-hertz frequency agility. In a preferred embodiment, the N-bit digital word is a 32-bit digital word. In some embodiments, the DDS 208 of the hybrid frequency synthesizer 200 is substantially similar to the DDS 108 of the hybrid system 100 shown in FIG. 1.

As shown in FIG. 2, an input of the DSM 224 is coupled to the output of the DDS 208 to receive the sampled, digital waveform generated by the DDS 208, and an output of the DSM 224 is coupled to an input of the DAC 226. The DSM 224 is configured to generate a digital, delta-sigma-modulated version of the digital waveform using oversampling, noise shaping, and other known techniques. In embodiments, the delta-sigma-modulated waveform is a lower resolution, but higher sample-frequency (e.g., higher sample rate) digital output than the high resolution digital waveform outputted by the DDS 208. For example, the DSM 224 can reduce a word length of the supplied signal by converting the N-bit (e.g., 32 bit) digital signal received from the DDS 208 into a faster sequence of zeros and ones comprised in an n-bit signal, where n is significantly less than N. In a preferred embodiment, the output of the DSM 224 is a one-bit signal with two amplitude states. In other embodiments, the output of the DSM 224 may be a four-bit signal, or any other signal with a lower resolution than the output of the DDS 208.

The output of the DSM 224 is provided to the DAC 226 to convert the zeros and ones into analog voltages. In this manner, the DAC 226 can reconstruct the frequency output of the DSM 224 to generate the analog output signal of the DSM-DDS circuit 201. In embodiments, the DAC 226 can be an n-bit digital-to-analog converter for recreating the desired waveform from the output of the DSM 224, where n is the same as the number of bits in the delta-sigma modulated signal. For example, in a preferred embodiment where the DSM 224 generates a one-bit output signal, the DAC 226 can be a one-bit DAC. According to embodiments, the n-bit DAC 226 can be an integrated circuit comprising CMOS technology, such as, for example, a field-programmable gate array ("FPGA") serializer/deserializer ("SerDes") circuit.

As will be appreciated, the PLL reference signal feeding the PLL 204 should contain very low noise and spurs because any noise or spurs in the reference signal will be multiplied, along with the phase of the reference signal, during operation of the integer N PLL 204 according to the formula 20*log 10(N). For example, if N=100, the reference phase will be multiplied by 40 decibels (dB). In such cases, an in-band spur at, for example, −100 dB relative to the carrier (dBc) on the reference signal would be "gained" up to −60 dBc at the output of the PLL 204.

In embodiments, the signal-to-noise ratio ("SNR") of the reference signal provided to the PLL 204 is greatly improved, as compared to conventional systems the hybrid system 100, by using the DSM-DDS circuit 201 to generate the PLL reference signal. More specifically, by placing the DSM 224 between the DDS 208 and the PLL 204, the quantization error introduced by the DSM 224 can be accurately controlled and/or shaped, such that the DSM-DDS circuit 201 produces a whitened, shaped, quantization noise at its output that is without spurs. This is possible due, at least in part, to the fact that the quantization error introduced during the delta-sigma modulation process is distributed in the frequency domain and moved to the higher frequencies. For example, the analog output signal of the DAC 226 may be like the desired waveform, but with higher frequency components that arise from the quantization error. These added frequency components can be easily removed from the analog output signal through filtering, for example, by an additional low pass filter (not shown) and/or the BPF 212. The PLL 204, itself, can also act as a bandpass filter for removing any spectral components of the reference frequency that are outside of a bandwidth of the PLL 204. Accordingly, the analog output signal generated by the DSM-DDS circuit 201 can be an ideal low noise, low spur reference signal for the PLL 204.

As will be appreciated, a frequency resolution of the PLL 204 is equal to the PLL reference frequency, and the PLL output frequency can be in steps of N multiplied by the PLL reference frequency, where N is the divisor value of the N divider 214. For example, if the reference frequency is 10 MHz and N equals 100, the PLL output frequency can be set to 1 GHz. In embodiments, frequency tuning of the PLL output signal can be split between coarse tuning and fine tuning Coarse tuning can be accomplished in increments of the reference frequency by adjusting the N divider of the integer N PLL 204. For example, if the reference frequency is 10 MHz, then an increment, or decrement, of N by 1 will move the PLL output frequency up, or down, by 10 MHz, respectively. Fine tuning can be accomplished by adjusting the frequency of the output signal synthesized by the DDS 208 over a small range of frequencies, with the corresponding fine adjustment increment of the PLL output frequency being equal to the step size of the DDS output signal multiplied by the value of N. For example, if the reference frequency is 10 MHz and the N value is 100, then the step size (also referred to as "bandwidth") of the DDS output is 10 MHz divided by 100, or 100 KHz. In such case, the DDS 208 need only tune the reference frequency over 100 KHz in order to adjust the PLL output frequency by 10 MHz. Given the small range of tuning required, the DDS 208 is a good fit for the narrower band DSM 224.

Thus, the hybrid frequency synthesizer 200 disclosed herein provides a low noise, low spurious, and fast locking synthesizing system that can achieve very accurate phase/frequency modulation and high frequency resolution. In some embodiments, the synthesizer 200 can be used as a local oscillator in a wireless receiver (e.g., a super-heterodyne receiver) of a spectrum scanner, a telecommunications device, professional audio equipment, or the like. In such cases, the hybrid frequency synthesizer 200 helps increase the ultimate SNR of the receiver, so that, for example, the receiver can process digitally modulated signals that require high SNRs (e.g., for a 64-QAM scheme). In addition, the lock time of the hybrid frequency synthesizer 200 can be fast enough to help mitigate audio artifacts when the wireless receiver is frequency hopping. In other embodiments, the hybrid frequency synthesizer 200 can be used for other purposes, such as, for example, to synthesize signals in a transmitter, to modulate signals in a modulator (e.g., a high quality FM modulator), or to provide a general purpose, high quality, agile signal source (e.g., a sample clock).

Moreover, the hybrid frequency synthesizer 200 provides several advantages over existing hybrid frequency synthesizer systems, such as, e.g., the hybrid system 100. For example, in a preferred embodiment, inclusion of the DSM 224 in between the DDS 208 and the PLL 204 allows the n-bit DAC 226 to be a 1-bit DAC, which lowers the overall cost and power consumption of the DSM-DDS circuit 201 and therefore, of the overall synthesizer 200. As will be appreciated, a 1-bit DAC is lower in cost, easier to manufacture, and consumes less power than the weighted Nyquist N-bit DAC 110 that is used by the conventional hybrid system 100. Further, the 1-bit DAC and the DSM 224 serve to simplify the circuitry of the synthesizer 200 as both align better with small geometry CMOS devices.

Figure 3:
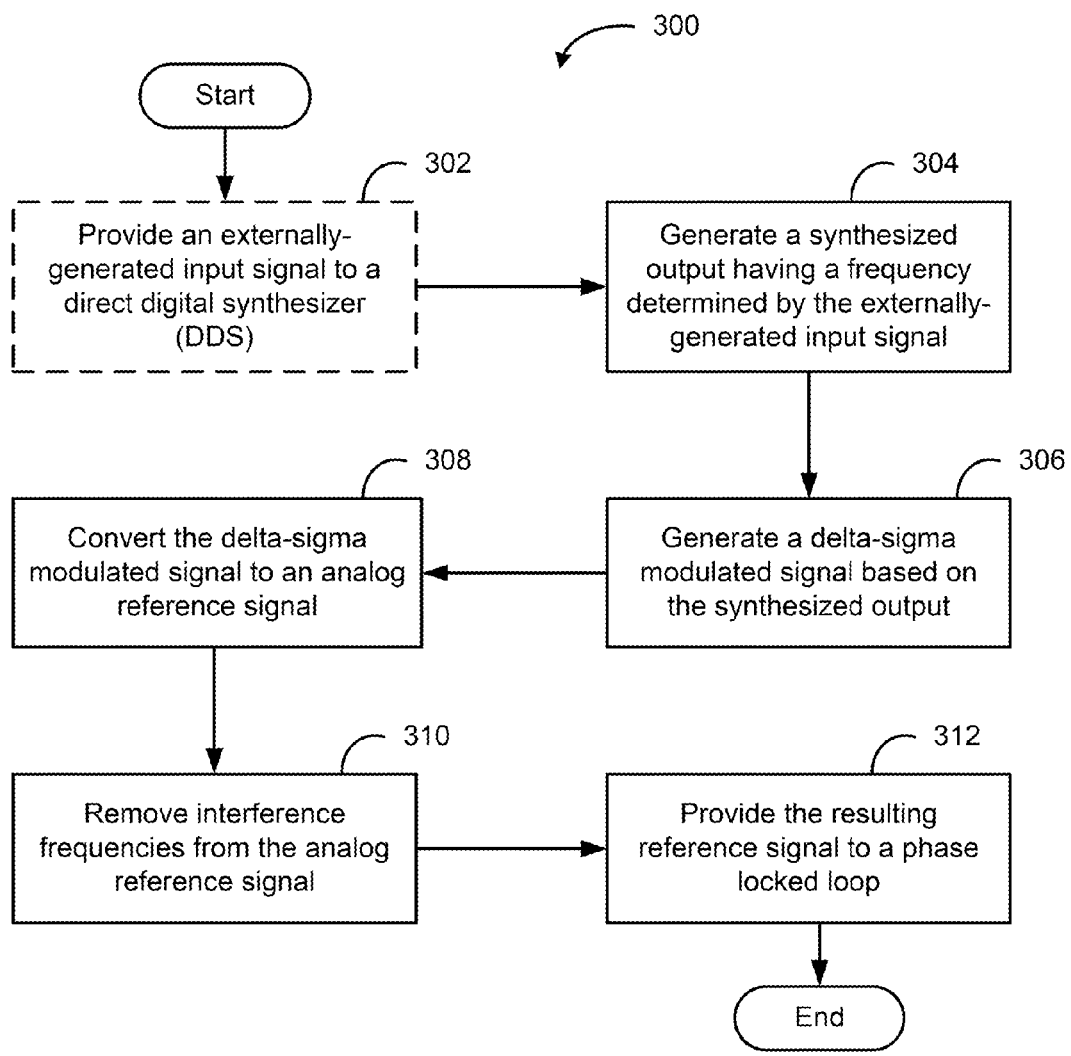
FIG. 3 is a flow diagram illustrating an example process for driving a phase locked loop in a hybrid frequency synthesizer in accordance with certain embodiments.

FIG. 3 illustrates an example method 300 of driving a phase locked loop in a hybrid frequency synthesizer in accordance with embodiments. In embodiments, the phase locked loop may be an integer-N phase locked loop, and the method 300 may be implemented using an electronic circuit comprising a direct digital synthesizer ("DDS"), a delta sigma modulator ("DSM"), a digital-to-analog converter ("DAC"), and a bandpass filter ("BPF"). In some embodiments, the phase locked loop may be substantially similar to the PLL 204, and the components of the electronic circuit may be substantially similar to the DDS 208, DSM 224, DAC 226, and BPF 212, respectively, shown in FIG. 2 and described herein. The steps of method 300 may be carried out using software and/or hardware. For example, in certain embodiments, the method 300 may be implemented as computer programming instructions stored in a memory and executed on a processor in communication with the memory.

In the illustrated embodiment, the method 300 includes, at step 302, providing an externally generated input signal (also referred to herein as a "DDS reference signal") to the direct digital synthesizer. In some embodiments, the direct digital synthesizer uses a 32-bit frequency tuning word. In some embodiments, the externally-generated signal source is a crystal reference oscillator coupled to the direct digital synthesizer. As illustrated, the method 300 further includes, at step 304, using the direct digital synthesizer, generating a synthesized output having a frequency determined by the externally-generated input signal. In embodiments, the synthesized output may be a sampled, digital version of the reference signal with a period controlled by the 32-bit frequency tuning word. At step 306, the method 300 includes using the delta-sigma modulator, generating a delta-sigma modulated signal based on the synthesized output provided by the direct digital synthesizer. In embodiments, the delta-sigma modulated signal may be a low resolution, high sample-rate version of the synthesized output.

At step 308, the method 300 further includes converting the delta-sigma modulated signal to an analog reference signal using the digital-to-analog converter coupled to the delta-sigma modulator. In embodiments, the digital-to-analog converter is a one-bit DAC, and the delta-sigma modulated signal is a one-bit (or two-state) signal. The method 300 also includes, at step 310, removing interference frequencies from the analog reference signal using the bandpass filter coupled to the delta-sigma modulator. The method 300 further includes, at step 312, providing an output signal of the bandpass filter to the phase locked loop as a reference signal for driving the phase locked loop. In embodiments, the output signal is a low noise, low spur reference signal.

Any process descriptions or blocks in figures should be understood as representing modules, segments, or portions of code which include one or more executable instructions for implementing specific logical functions or steps in the process, and alternate implementations are included within the scope of the embodiments of the invention in which functions may be executed out of order from that shown or discussed, including substantially concurrently or in reverse order, depending on the functionality involved, as would be understood by those having ordinary skill in the art.

This disclosure is intended to explain how to fashion and use various embodiments in accordance with the technology rather than to limit the true, intended, and fair scope and spirit thereof. The foregoing description is not intended to be exhaustive or to be limited to the precise forms disclosed. Modifications or variations are possible in light of the above teachings. The embodiment(s) were chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the embodiments as determined by the appended claims, as may be amended during the pendency of this application for patent, and all equivalents thereof, when interpreted in accordance with the breadth to which they are fairly, legally and equitably entitled.

The invention claimed is:

1. A hybrid frequency synthesizer, comprising:
    a direct digital synthesizer configured to generate a digital output signal having a frequency determined by an input signal received from an externally-generated signal source;
    a delta sigma modulator configured to generate a delta-sigma modulated signal based on the digital output signal, the delta sigma modulator being coupled to the direct digital synthesizer;
    a digital-to-analog converter configured to convert the delta-sigma modulated signal into an analog output signal, the digital-to-analog converter being coupled to the delta-sigma modulator;
    a bandpass filter configured to remove interference frequencies from the analog output signal, the bandpass filter being coupled to the digital-to-analog converter; and
    a phase locked loop coupled to the band pass filter and driven by a reference signal received therefrom.

2. The hybrid frequency synthesizer of claim 1, wherein the externally-generated signal source is a crystal reference oscillator.

3. The hybrid frequency synthesizer of claim 1, wherein the digital-to-analog converter is a one-bit digital-to-analog converter.

4. The hybrid frequency synthesizer of claim 1, wherein the direct digital synthesizer uses a 32-bit frequency tuning word.

5. The hybrid frequency synthesizer of claim 1, wherein the phase locked loop is an integer-N phase locked loop.

6. The hybrid frequency synthesizer of claim 1, wherein the phase locked loop is included in a local oscillator of a receiver.

7. An electronic circuit for driving a phase locked loop, the electronic circuit comprising:
    a direct digital synthesizer configured to generate a digital output signal having a frequency determined by an input received from an externally-generated signal source;
    a delta sigma modulator configured to generate a delta-sigma modulated signal based on the digital output signal, the delta sigma modulator being coupled to the direct digital synthesizer;
    a digital-to-analog converter configured to convert the delta-sigma modulated signal into an analog output signal, the digital-to-analog converter being coupled to the delta-sigma modulator; and
    a bandpass filter coupled to the digital-to-analog converter and configured to remove interference frequencies from the analog output signal and provide a reference signal for driving the phase locked loop.

8. The electronic circuit of claim 7, wherein the externally-generated signal source is a crystal reference oscillator.

9. The electronic circuit of claim 7, wherein the digital-to-analog converter is a one-bit digital-to-analog converter.

10. The electronic circuit of claim 7, wherein the direct digital synthesizer uses a 32-bit frequency tuning word.

11. The electronic circuit of claim 7, wherein the phase locked loop is an integer-N phase locked loop.

12. A method of driving a phase locked loop in a hybrid frequency synthesizer, the method comprising:
    using a direct digital synthesizer, generating a synthesized output having a frequency determined by an input received from an externally-generated signal source;
    using a delta-sigma modulator, generating a delta-sigma modulated signal based on the synthesized output provided by the direct digital synthesizer;

converting the delta-sigma modulated signal to an analog reference signal using a digital-to-analog converter coupled to the delta-sigma modulator;

removing interference frequencies from the analog reference signal using a bandpass filter coupled to the delta-sigma modulator; and providing an output signal of the bandpass filter to the phase locked loop as a reference signal for driving the phase locked loop.

13. The method of claim 12, wherein the externally-generated signal source is a crystal reference oscillator coupled to the direct digital synthesizer.

14. The method of claim 12, wherein the digital-to-analog converter is a one-bit digital-to-analog converter.

15. The method of claim 12, wherein the phase locked loop is an integer-N phase locked loop.

16. The method of claim 12, wherein the direct digital synthesizer uses a 32-bit frequency tuning word.

\* \* \* \* \*